United States Patent
Tay et al.

(10) Patent No.: US 6,359,263 B2
(45) Date of Patent: *Mar. 19, 2002

(54) SYSTEM FOR CONTROLLING THE TEMPERATURE OF A REFLECTIVE SUBSTRATE DURING RAPID HEATING

(75) Inventors: Sing Pin Tay, Fremont; Yao Zhi Hu; Randhir P. S. Thakur, both of San Jose; Arnon Gat, Palo Alto, all of CA (US)

(73) Assignee: Steag RTP Systems, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/390,305

(22) Filed: Sep. 3, 1999

(51) Int. Cl.[7] .................................................. A21B 1/00
(52) U.S. Cl. ..................... 219/411; 219/390; 219/405; 118/724; 392/416
(58) Field of Search ................................ 219/390, 405, 219/411; 118/724, 725, 50.1; 392/416, 418

(56) References Cited

U.S. PATENT DOCUMENTS

| | | |
|---|---|---|
| 4,981,815 A | 1/1991 | Kakoschke |
| 5,259,881 A | 11/1993 | Edwards et al. |
| 5,551,985 A * | 9/1996 | Brors et al. .................. 118/725 |
| 5,678,989 A | 10/1997 | Okase |
| 5,856,652 A * | 1/1999 | Mayuzumi ................... 219/405 |
| 5,861,609 A * | 1/1999 | Kaltenbrunner et al. .... 219/390 |
| 6,034,357 A * | 3/2000 | Guardado .................... 219/390 |

FOREIGN PATENT DOCUMENTS

| | | |
|---|---|---|
| EP | 0926719 A2 | 12/1998 |
| WO | 9855842 | 12/1998 |

OTHER PUBLICATIONS

Japanese Patent Abstract, Publication No. 61289620, Publication Date Dec. 19, 1986, Applicant—Sont Corp., Inventor—Hayashi Hisao.
PCT International Search Report dated Jan. 12, 2001 for International Application No. PCT/IB00/01222.

* cited by examiner

Primary Examiner—Teresa Walberg
Assistant Examiner—Shawntina Fuqua
(74) Attorney, Agent, or Firm—Dority & Manning, P.A.

(57) ABSTRACT

A system and process is disclosed for rapidly heating semiconductor wafers coated with a highly reflective material on either the whole wafer or in a patterned area. The wafers are heated in a thermal processing chamber by a plurality of lamps. In order for the wafer coated with the highly reflective material to more rapidly increase in temperature with lower power intensity, a shield member is placed in between the wafer and the plurality of lamps. The shield member is made from a high emissivity material, such as ceramic, that increases in temperature when exposed to light energy. Once heated, the shield member then in turn heats the semiconductor wafer with higher uniformity. In one embodiment, the shield member can also be used to determine the temperature of the wafer as it is heated.

15 Claims, 5 Drawing Sheets

SYSTEM FOR CONTROLLING THE TEMPERATURE OF A REFLECTIVE SUBSTRATE DURING RAPID HEATING

FIELD OF THE INVENTION

The present invention generally relates to a method and system for heating semiconductor wafers coated with reflective surfaces. More particularly, the present invention is directed to a method and system for uniformly heating a wafer coated with a reflective coating by placing a ceramic shield adjacent to the wafer.

BACKGROUND OF THE INVENTION

A thermal processing chamber as used herein refers to a device that rapidly heats objects, such as semiconductor wafers. Such devices typically include a substrate holder for holding a semiconductor wafer and a light source that emits light energy for heating the wafer. During heat treatment, the semiconductor wafers are heated under controlled conditions according to a preset temperature regime. During heating, various processes can be carried out within the thermal processing chamber, such as rapid thermal oxidation, reduction, nitridation, annealing, and silicidation.

Many semiconductor heating processes require a wafer to be heated to high temperatures so that the various chemical and physical transformations can take place as the wafer is fabricated into a device. During rapid thermal processing, for instance, semiconductor wafers are typically heated by an array of lights to temperatures from 400° C. to about 1200° C., for times that are typically less than a few minutes. During these processes, the main goal is to heat the wafers as uniformly as possible.

In the past, in order to control the temperature of a wafer during heating and in order to heat the wafer as uniformly as possible, the temperature of the wafer was monitored during heating and this information was sent to a controller for controlling the heating source in the thermal processing chamber in a manner that heated the wafer as desired. In order to monitor the temperature of the wafer during heating, one or more pyrometers were used. A pyrometer measures the temperature of the wafer by sensing the amount of thermal radiation being emitted by the wafer. Of particular advantage, pyrometers can measure the temperature of the wafers without contacting the wafers.

However, in some applications, conventional methods of heating semiconductor wafers are not effective. For example, semiconductor wafers are often coated with a reflective-material such as copper. Typically, a reflective surface will reflect much of the heat emitted by a thermal processing chamber. As a result, the intensity of the heat source must be significantly increased so that the semiconductor wafer can absorb the energy required to increase in temperature to a desired level. Furthermore, the reflective surface can make it much more difficult to accurately monitor and control the temperature of the wafer.

As such, a need currently exists for a system and method of uniformly heating a semiconductor wafer having a reflective surface. A need also exists for a system that monitors and controls the temperature of a semiconductor wafer coated with a reflective surface.

SUMMARY OF THE INVENTION

The present invention recognizes and addresses the foregoing disadvantages, and others of prior art constructions and methods.

Accordingly, it is an object of the present invention to provide an improved method and system for heating semiconductor wafers coated with reflective materials.

Another object of the present invention is to provide a method and system for uniformly heating a semiconductor wafer coated with a reflective material.

Still another object of the present invention is to provide a system and method for monitoring and controlling the temperature of a semiconductor wafer coated with a reflective material during thermal processing.

It is another object of the present invention is to provide a method and system for effectively heating semiconductors wafers having a reflective surface using a ceramic shield member positioned adjacent to the wafer.

These and other objects of the present invention are achieved by providing an apparatus for heating semiconductor wafers that are coated with a reflective surface, such as copper. The apparatus includes a thermal processing chamber adapted to contain and heat semiconductor wafers. In particular, for heating the wafers, a heating device is placed in communication with the thermal processing chamber. The heating device can include, for instance, a plurality of light energy sources that emit thermal light energy onto the wafers.

In accordance with the present invention, a shield member is contained within the thermal processing chamber and is positioned adjacent to the semiconductor wafer coated with a reflective surface being heated. The shield member is placed in direct association with the heating device. The shield member is made from a material that increases in temperature when contacted with light energy. For instance, the shield member can be made from a ceramic material.

In one embodiment, the shield member is generally placed within about 10 millimeters above the semiconductor wafer, and particularly between about 3 millimeters to about 8 millimeters above the wafer. Due to its close proximity to the wafer, the shield member can absorb much of the light energy being emitted by the heating device and reflected by the reflective surface of the semiconductor wafer. By absorbing light energy, the shield member increases in temperature and then transfers heat to the wafer until the wafer is heated to an appropriate temperature. As a result, the semiconductor wafer can be heated at a faster rate than otherwise would be possible.

The present invention is particularly well suited for heating copper-coated semiconductor wafers in the presence of ambient gases during thermal processing. For example, a copper-coated semiconductor wafer can be heated in the presence of oxidizing and reducing gases for circuit fabrication.

In one embodiment of the present invention, a copper-coated semiconductor wafer can first be heated in accordance with the present invention in the presence of oxidizing gases, such as oxygen, water vapor, or other oxidizing gases in order to form an oxide coating on the wafer. In general, the wafer can be heated to a temperature between about 100° C. to about 600° C., and particularly between about 200° C. to about 450° C. Thereafter, the copper oxide-coated semiconductor wafer is then heated in the presence of a reducing ambient gas, such as hydrogen according to the present invention. The reducing atmosphere converts the copper oxide coating back into copper. During this transformation, copper reflow occurs creating a smooth and uniform copper surface.

A temperature sensing device can be placed in association with the shield member for monitoring the temperature of the shield member during thermal processing. According to the present invention, by monitoring the temperature of the shield member during thermal processing, the temperature of the semiconductor wafer coated with the reflective material can be derived. In particular, a calibration can be constructed for determining a relationship between the temperature of the shield member and the temperature of the semiconductor wafer.

For instance, in one embodiment, the temperature of the shield member can be monitored using one or more thermocouples. In this manner, thermocouples can be used to monitor the temperature of the semiconductor wafer coated with the reflective material without having to actually contact the wafer. It should be understood however, that besides thermocouples, other temperature sensing devices can be used to monitor the shield member temperature. For example, pyrometers can also be used to monitor the temperature.

The system of the present invention can also include a controller, such as a microprocessor, which can be placed in communication with the temperature sensing devices and the heating device. Based upon the temperature received from the temperature sensing devices, the controller can be programmed to control the amount of thermal energy being emitted by the heating device for heating the wafer according to a preset temperature regime.

Other objects, features and aspects of the present invention are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying figures, in which.

Repeat use of reference characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to a method and system for rapidly heating an object coated with a reflective material. More particularly, the present invention is directed to a rapid thermal processing system that can efficiently heat a semiconductor wafer having a reflective surface in a thermal processing chamber. During thermal processing, the system of the present invention is also capable of uniformly heating a semiconductor wafer coated with a reflective material and effectively controlling its temperature.

In order to provide efficient and controlled heating of a semiconductor wafer having a reflective surface according to the present invention, a shield member, such as made from a ceramic material or other suitable material, is positioned closely adjacent to the wafer. The shield member improves the transfer of heat to the semiconductor wafer during heating.

Specifically, the shield member absorbs energy being emitted by a plurality of lamps associated with the thermal processing chamber and then transfers this energy to the semiconductor wafer coated with the reflective material. Without such a shield member, heat reflected by the reflective surface would be transferred to surrounding gases and walls of the chamber, thus requiring a longer amount of time before eventually being absorbed by the wafer. However, by quick absorption and transfer of such heat, the shield member of the present invention can substantially increase the heating rate of the semiconductor wafer coated with the reflective material. Due to the increased heating rate, one advantage of the present invention is that the heating source becomes more efficient because the necessary wafer temperature can be reached with lower lamp intensity. Furthermore, because lower lamp intensity is needed, the average lifetime of a pin-seal of the lamp can be extended.

Another advantage of the present invention is that the wafer can be uniformly heated. In the past, a semiconductor wafer coated with a reflective surface demonstrated markedly non-uniform heating. In particular, the wafer edges became significantly hotter than the wafer center due to heat reflected by the surface. However, in contrast to prior art constructions, the system of the present invention provides uniform heating through the use of a shield member that can uniformly absorb and redirect heat reflected from the semiconductor wafer.

Yet another advantage of the present invention is that the temperature of a semiconductor wafer coated with a reflective material can be adequately monitored and controlled. In the past, the temperature of the semiconductor wafer was generally dependent on the reflectivity of the wafer surface and the conductivity of the gases used during processing. In contrast to prior art constructions, the system of the present invention allows consistent control of the wafer temperature, independent of the coated surface or gas used.

Figure 1:
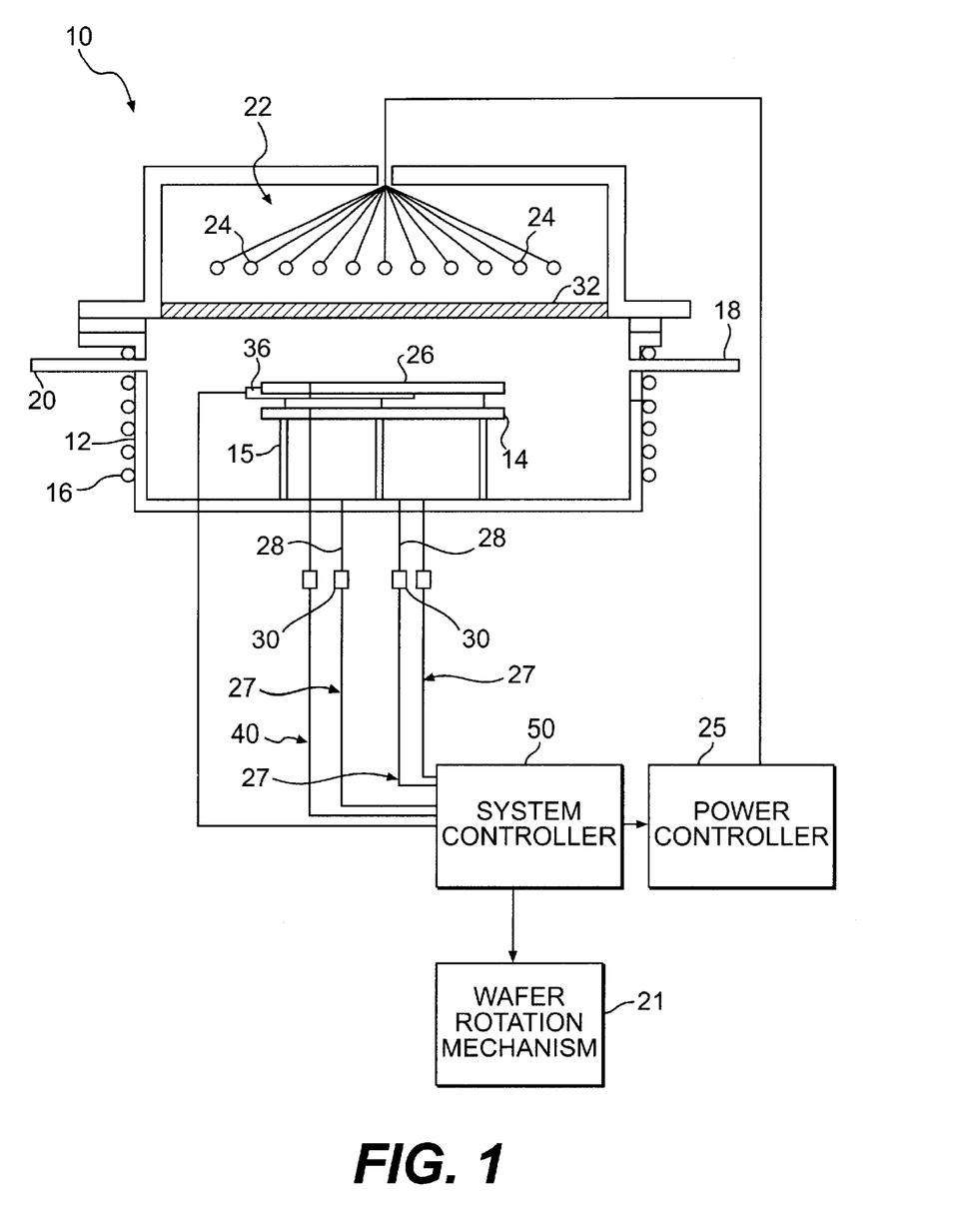
FIG. 1 is a cross-sectional view of one embodiment of a thermal processing chamber containing a shield member in accordance with the present invention.

Referring to FIG. 1, one embodiment of a system generally 10 constructed in accordance with the present invention for heat treating a semiconductor wafer having a reflective surface, such as a copper film, is illustrated. As shown, system 10 includes a copper-coated wafer 14. Copper-coated wafer 14 is generally comprised of two layers, specifically, a reflective copper film coated onto a silicon substrate.

In general, reflective surfaces are often used on wafers for the purpose of circuitry interconnect during integrated circuit fabrication. For example, copper can be integrated into advance metallization schemes as a low resistant and highly reliable interconnect material.

When fabricating integrated circuits, it is generally desired that the metal coating be as uniform as possible with a planar topography so that a particular material can be stacked onto the coating with a minimal loss of reliability in the finished devices. To enhance surface uniformity, the particular metal surface is often oxidized and reduced.

In general, a reflective metal surface of a semiconductor wafer can be partially oxidized with the aid of an oxidizing ambient, such as oxygen or water vapor. The oxidizing temperatures can generally range from about 100° C. to about 600° C. In particular, one embodiment of the present invention includes a copper film that is oxidized by a water vapor ambient at a temperature from about 200° C. to about 450° C. After oxidation, a reducing ambient, such as hydrogen or forming gas, can then be employed to reduce the oxidized metal surface back to its original thickness and constituency. The reduction of the metal oxide layer provides a localized elevation of temperature, which allows the metal to migrate into vacant trenches of the wafer without adversely affecting the properties of the wafer substrate itself.

In one embodiment, a hydrogen gas ambient is used to reduce an oxidized layer of copper film. The result of such oxidation and reduction is normally a more uniform and planar layer of metal coating, free of void and seam, for integrated circuit fabrication.

In accordance with the present invention, a system 10 is provided that can effectively heat a copper-coated wafer 14 during rapid thermal processes such as oxidation and reduction. Although the embodiments described herein generally relate to heating during oxidation and/or reduction, it should be understood that the present invention is also intended to anticipate and cover heating during all other rapid thermal processes.

As shown, system 10 includes a processing chamber 12 adapted to receive substrates, such as a copper-coated wafer 14, for conducting various thermal processes. Although the embodiment shown in FIG. 1 includes a wafer coated with a copper surface, it should be understood that a wafer of the present invention could be coated with various other reflective materials, such as other metal films.

As depicted in FIG. 1, copper-coated wafer 14 is positioned on a substrate holder 15 made from a thermal insulating material such as quartz. Chamber 12 is designed to heat copper-coated wafer 14 at very rapid rates and under carefully controlled conditions. Chamber 12 can be made from various materials, including metals and ceramics. For instance, chamber 12 can be made from stainless steel or quartz.

When chamber 12 is made from a heat conductive material, the chamber preferably includes a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a constant temperature.

Chamber 12 can also include a gas inlet 18 and a gas outlet 20 for introducing gases into the chamber and/or maintaining the chamber within a preset pressure range. For instance, a gas can be introduced into chamber 12 through gas inlet 18 for reaction with copper-coated wafer 14. Once processed, the gas can then be evacuated from the chamber using gas outlet 20. In one embodiment of the present invention, ambient gases can be fed to chamber 12 through gas inlet 18 to react with a metal film coated onto copper-coated wafer 14. Examples of ambient gases can include oxidizing gases, such as oxygen or water vapor, and reducing gases, such as hydrogen or forming gas.

In addition to ambient gases, an inert gas can also be fed to chamber 12 through gas inlet 18 for preventing any unwanted or undesirable side reactions from occurring within chamber 12. In a further embodiment, gas inlet 18 and gas outlet 20 can be used to pressurize chamber 12. A vacuum can also be created in chamber 12 when desired using gas outlet 20 or an additional larger outlet positioned beneath the level of copper-coated wafer 14.

During processing, substrate holder 15, in one embodiment, can be adapted to rotate copper-coated wafer 14 using a wafer rotation mechanism 21. Rotating the wafer promotes greater temperature uniformity over the surface of the wafer and promotes enhanced contact between copper-coated wafer 14 and any gases introduced into the chamber. It should be understood, however, that besides wafers, chamber 12 is also adapted to process optical parts, films, fibers, ribbons, and other substrates having any particular shape.

A heat source or heating device generally 22 is included in communication with chamber 12 for heating copper-coated wafer 14 during processing. Heating device 22 includes a plurality of lamps 24, such as tungsten-halogen lamps. As shown in FIG. 1, lamps 24 are placed above copper-coated wafer 14. It should be understood, however, that lamps 24 may be placed at any location. Further, additional lamps can be included within system 10 if desired.

The use of lamps 24 as a heat source is generally preferred. For instance, lamps have much higher heating and cooling rates than other heating devices, such as electrical elements or conventional furnaces. Lamps 24 create a rapid isothermal processing system that provide instantaneous energy, typically requiring a very short and well controlled start up period. The flow of energy from lamps 24 can also be abruptly stopped at any time. As shown in FIG. 1, lamps 24 are equipped with a gradual power controller 25 that can be used to increase or decrease the thermal energy being emitted by the lamps.

In the embodiment depicted in FIG. 1, system 10 also includes a window 32 that is positioned between lamps 24 and thermal processing chamber 12. Window 32 serves to isolate lamps 24 from wafer 14 and prevent contamination of the chamber.

In accordance with the present invention, to increase the heating rate of copper-coated wafer 14, thermal processing chamber 12 includes a shield member 26 placed above copper-coated wafer 14 in this embodiment. In general, shield member 26 is placed between lamps 24 and wafer 14 and can generally be placed at any distance away from copper-coated wafer 14. However, to further increase the heating rate of copper-coated wafer 14, shield member 26 is preferably placed less than about 10 mm from copper-coated wafer 14. More particularly, it is preferred that shield member 26 be place between about 3 mm to about 8 mm from copper-coated wafer 14.

According to the present invention, shield member 26 is made from a material that will increase in temperature as the wafer is heated. In particular, shield member 26 is made from a material that will have heating characteristics somewhat similar to the substrate of copper-coated wafer 14. For example, shield member 26 can be made from a ceramic material. Some ceramic materials that can be used in the present invention include, but are not limited to, silicon carbide, such as hot pressed silicon carbide or silicon carbide formed by chemical vapor deposition, polycrystalline silicon, or substrates coated with silicon carbide.

Shield member 26 enables system 10 to heat copper-coated wafer 14 at a faster rate than otherwise would be possible. For example, without shield member 26, approximately 99% of the energy from lamps 24 would be reflected by the copper surface and transferred to surrounding gases.

However, because shield member 26 can absorb approximately 100% of the heat with which it thermally communicates, it absorbs thermal energy being emitted by the lamps and essentially all of the heat reflected by the copper surface, thereby preventing the heat from escaping to surrounding gases. Thereafter, the transfer of energy absorbed by shield member 26 to copper-coated wafer 14 can occur relatively quickly due to the close proximity in which shield member 26 is placed with respect to copper-coated wafer 14. It has been demonstrated that the system of the present invention can provide high temperature ramp rates to achieve higher wafer temperature with a lower lamp intensity and a lower lamp pinch seal temperature, thereby increasing the lamp lifetime.

The transfer of energy from shield member 26 to copper-coated wafer 14 can generally occur by radiation and/or convection. The mechanisms of such heat transfer are mathematically described as follows:

Heat Transfer by Radiation $$Q_R = \frac{\sigma(T_1^4 - T_2^4)}{\frac{1}{\varepsilon_1} + \frac{1}{\varepsilon_2} - 1}$$

where, $\varepsilon_1$ and $\varepsilon_2$ are the shield member and Cu surface emissivity, $T_1$ and $T_2$ are the absolute temperature of the shield and Cu surface, and $\sigma$ is the Stefan-Boltzmann constant; and Heat Transfer by Convection $$Q_C = h(T_1 - T_2)$$

where, h is the convection heat transfer coefficient that is dependent on gas conductivity and other properties, and $T_1$ and $T_2$ are the absolute temperature of the shield member and Cu surface.

When temperatures are high, $Q_R$ is generally higher than $Q_C$ and radiation is the primary mode of heat transfer. However, when temperatures are low (such as less than about 500° C.), $Q_C$ is generally higher then $Q_R$ and convection is the primary mode of heat transfer.

Besides providing increased heating rates, shield member 26 also serves to promote temperature uniformity throughout copper-coated wafer 14. For instance, during thermal processing, shield member 26 increases in temperature. Once heated, shield member 26 emits thermal radiation that is absorbed by wafer 14 in a manner that promotes a uniform temperature distribution throughout the wafer.

In order to monitor the temperature of copper-coated wafer 14 during the heating process, the system of the present invention includes various mechanisms for sensing temperature. Because shield member 26 is generally made from a material that will increase in temperature as copper-coated wafer 14 is heated, a calibration curve can be constructed through testing and calibration for correlating temperatures between shield member 26 and copper-coated wafer 14. Specifically, a calibration curve constructed in accordance with the present invention will indicate the temperature of copper-coated wafer 14 by knowing the temperature of shield member 26 during thermal processing.

Shield member 26 can be calibrated to give accurate temperature readings in a number of ways. For instance, shield member 26 can be heated in combination with a semiconductor wafer. In particular, the wafer being heated can be directly connected to a thermocouple. During heating, the temperature of the wafer can be monitored while simultaneously monitoring the temperature of the shield member. The temperature of the shield member can be generally monitored by a thermocouple or radiation-sensing device, such as a pyrometer. From this data, a calibration curve can be constructed.

Figure 2:
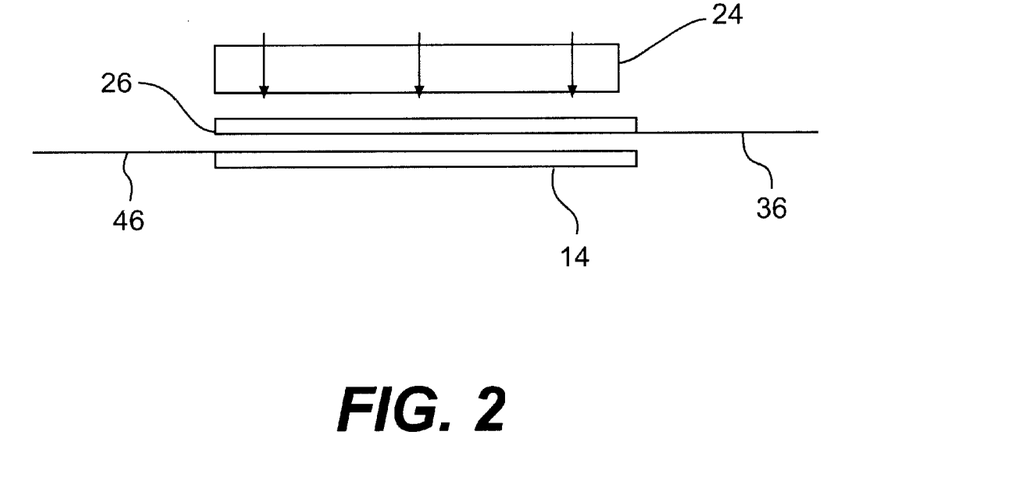
FIG. 2 is a cross-sectional view of one embodiment of a thermal processing chamber containing a shield member and a thermocouple in accordance with the present invention.

Referring to FIG. 2, one embodiment for calibrating a system 10 is illustrated. As shown, thermocouple 46 is affixed, such as through the use of an adhesive, to the copper coated surface of wafer 14. Furthermore, thermocouple 36 is similarly affixed to shield member 26. In general, any suitable thermocouple may be used in the process of the present invention. For instance, thermocouples 36 and 46 can be R-type thermocouples, S-type thermocouples, or thin film thermocouples. Further, more than one thermocouple can be placed in association with shield member 26 and copper-coated wafer 14 for monitoring temperatures at a variety of locations during calibration.

Once calibrated, the temperature of copper-coated wafer 14 can be determined by monitoring the temperature of shield member 26 and calculating the wafer temperature through the use of the calibration curve. The temperature of shield member 26 can be monitored during processing through the use of a thermocouple, as shown in FIG. 2, or through the use of one or more radiation sensing devices, such as a pyrometer.

As shown in FIG. 1, system 10 can further include a system controller 50 that can be, for instance, a microprocessor. In the embodiment illustrated, controller 50 is placed in communication with thermocouple 36. In particular, controller 50 is configured to receive voltage signals from thermocouple 36 indicating the temperature of shield member 26. Based on the signals received, controller 50 is then configured to calculate the temperature of copper-coated wafer 14.

System controller 50, as shown in FIG. 1, can also be in communication with lamp power controller 25. In this arrangement, controller 50 can determine the temperature of copper-coated wafer 14, and, based on this information, control the amount of thermal energy being emitted by lamps 24. In this manner, instantaneous adjustments can be made regarding the conditions within reactor 12 for processing copper-coated wafer 14 within carefully controlled limits.

In one embodiment, controller 50 can also be used to automatically control other elements within the system. For instance, controller 50 can be used to control the flow rate of gases entering chamber 12 through gas inlet 18. As shown, controller 50 can further be used to control the rate at which copper-coated wafer 14 is rotated within the chamber.

Figure 3:
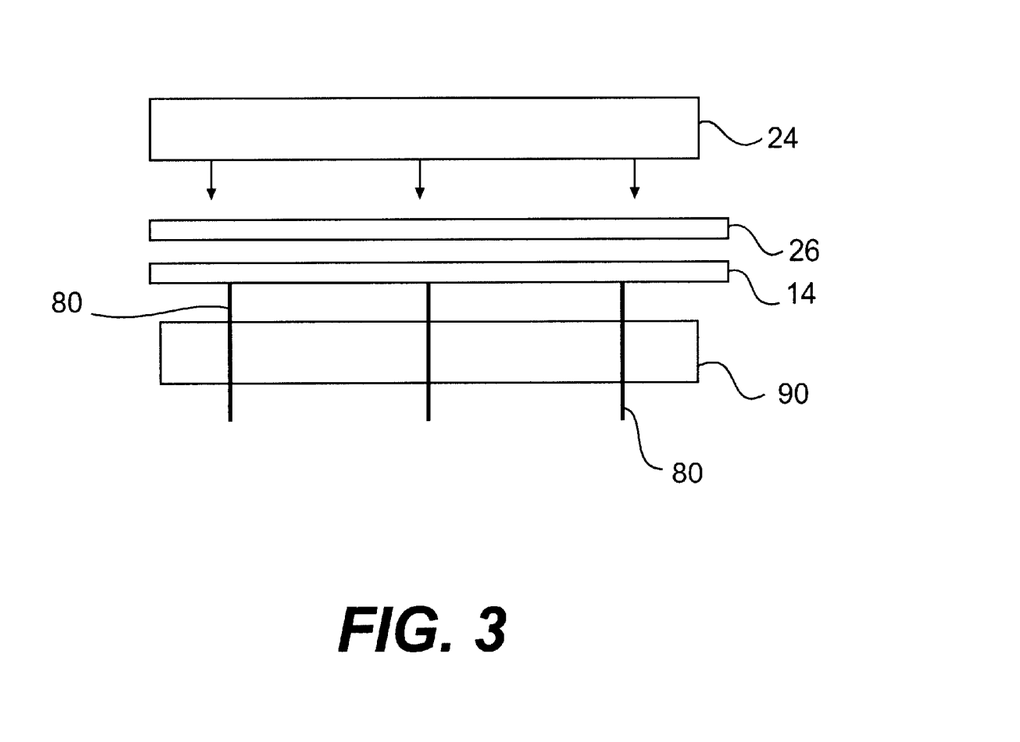
FIG. 3 is a cross-sectional view of another embodiment of a thermal processing chamber containing a shield member, cold plate, and elevators in accordance with the present invention.

Referring to FIG. 3, one embodiment of system 10 constructed in accordance with the present invention is illustrated. The embodiment depicted in FIG. 3 is essentially identical to the system illustrated in FIG. 1. However, the embodiment shown in FIG. 3 further includes elevators 80 that are capable of maneuvering copper-coated wafer 14 in an upward or downward direction. In particular, elevators 80 can move copper-coated wafer 14 in an upward direction, towards lamps 24, during processing. Likewise, when it is desired to rapidly cool the wafer after processing, elevators 80 can move copper-coated wafer 14 in a downward direction, where the wafer can contact cold plate 90 for cooling.

The present invention may be better understood with reference to the following example.

EXAMPLE

The following three experiments were performed to demonstrate the effectiveness of the system of the present invention in heating a semiconductor wafer coated with a reflective surface in a thermal processing chamber.

In the first experiment, a silicon wafer coated with a copper film was placed in a thermal processing chamber and attached to a thermocouple. The wafer was then heated. After heating and subsequent cooling, a shield member made in accordance with the present invention was placed 3 mm above the wafer. Again, the wafer was heated and subsequently cooled. Thereafter, the shield member was moved to a position 8 mm above the wafer, and was once again heated. The temperature of the wafer was determined for each test as a function of time.

Figure 4:
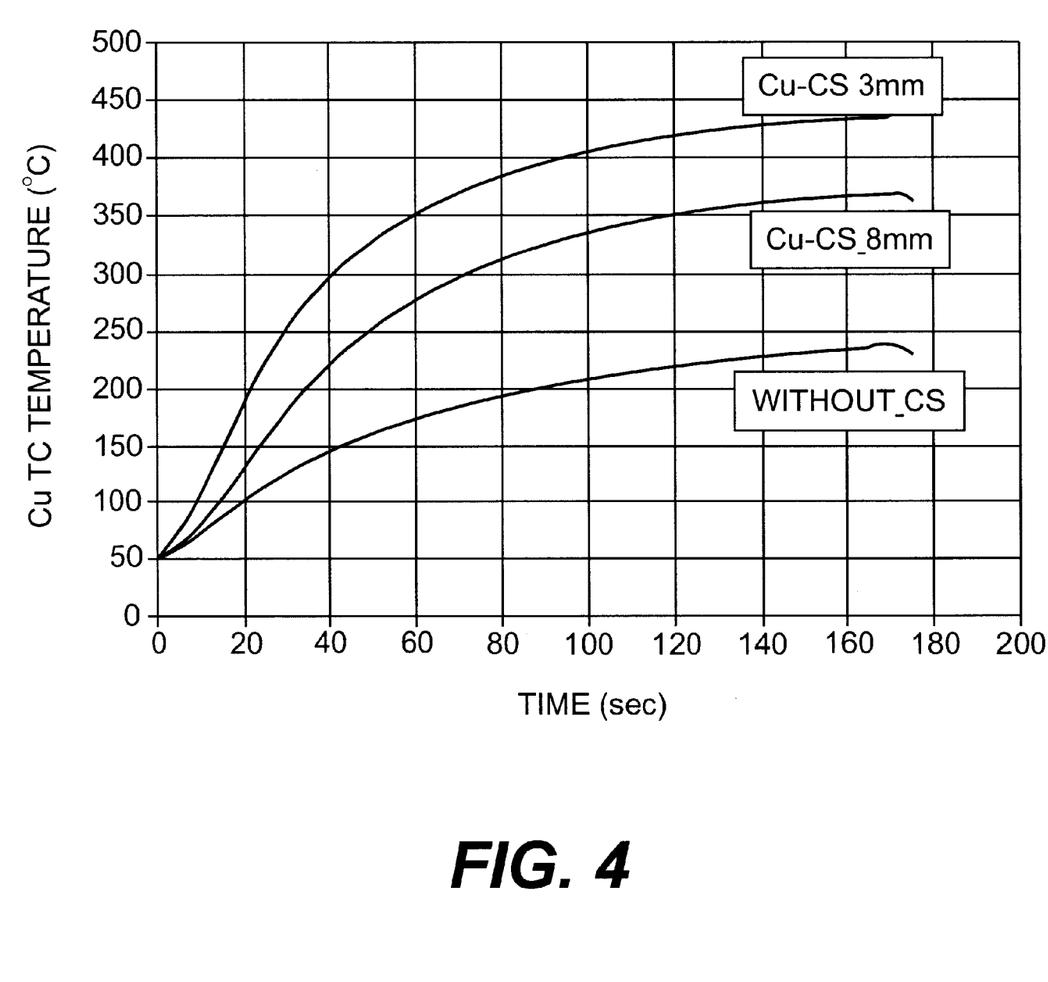
FIG. 4 is a graphical representation of the results obtained in the Example.
Figure 5:
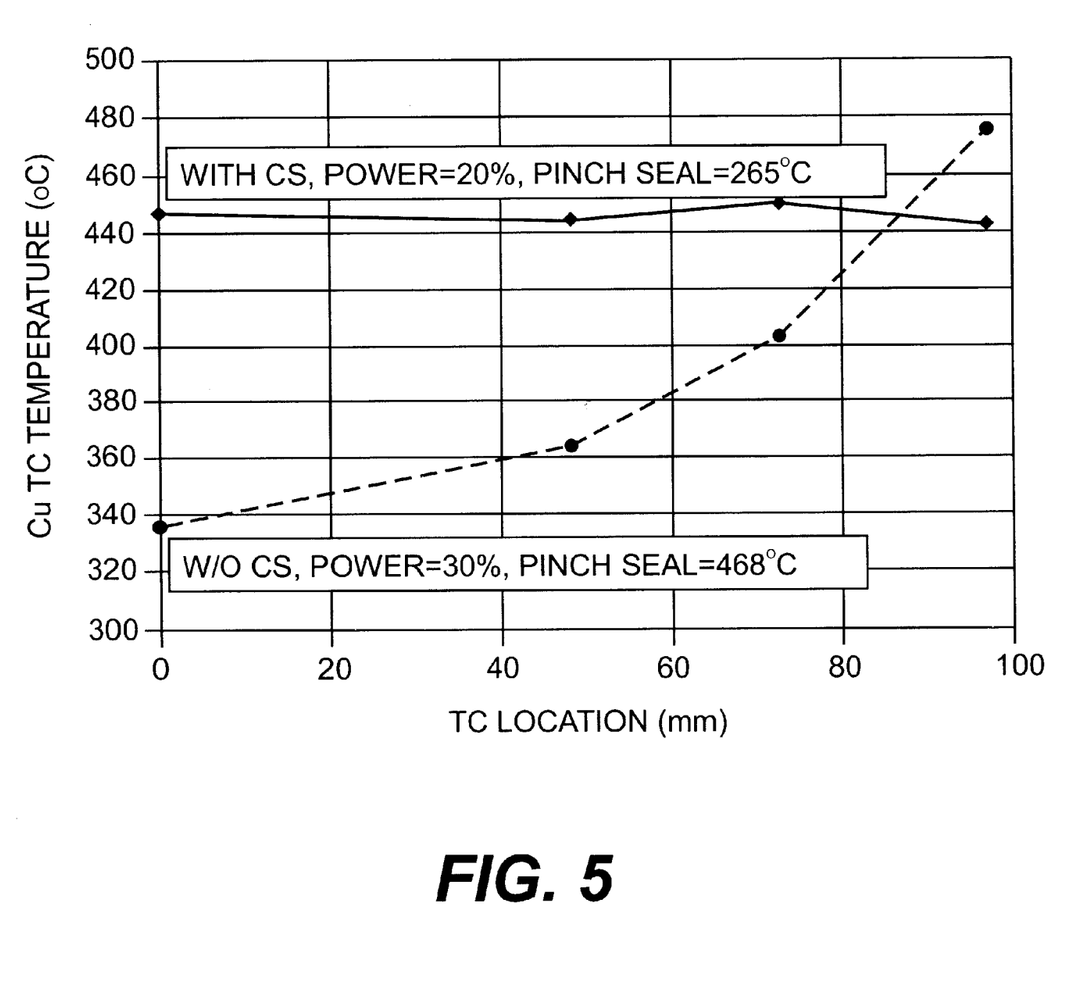
FIG. 5 is a graphical representation of the results obtained in the Example.

The results are illustrated in FIGS. 4 and 5. As shown in FIGS. 4 and 5, by using a shield member, the heating rate of the wafer was significantly increased such that less lamp power was required. Moreover, as illustrated by FIG. 5, when heated with a shield member of the present invention, a copper-coated wafer can achieve uniform temperature distribution from its edges to the center. Further, lower lamp pinch seal temperatures can be achieved with a system of the present invention. As such, the overall lifetime of the lamp can be increased.

Once the above results were obtained, a second, similar experiment was conducted to demonstrate the broad process applications of the system of the present invention. In particular, the experiment demonstrates that the system operates independent of the process gas ambient. First, the wafer was heated in the presence of nitrogen. After heating and subsequent cooling, the wafer was again heated in the presence of helium. Subsequently, the above steps were repeated, except that a shield member made in accordance with the present invention was placed 8 mm above the copper-coated wafer. The temperature of the wafer was determined for each test as a function of time.

Figure 6:
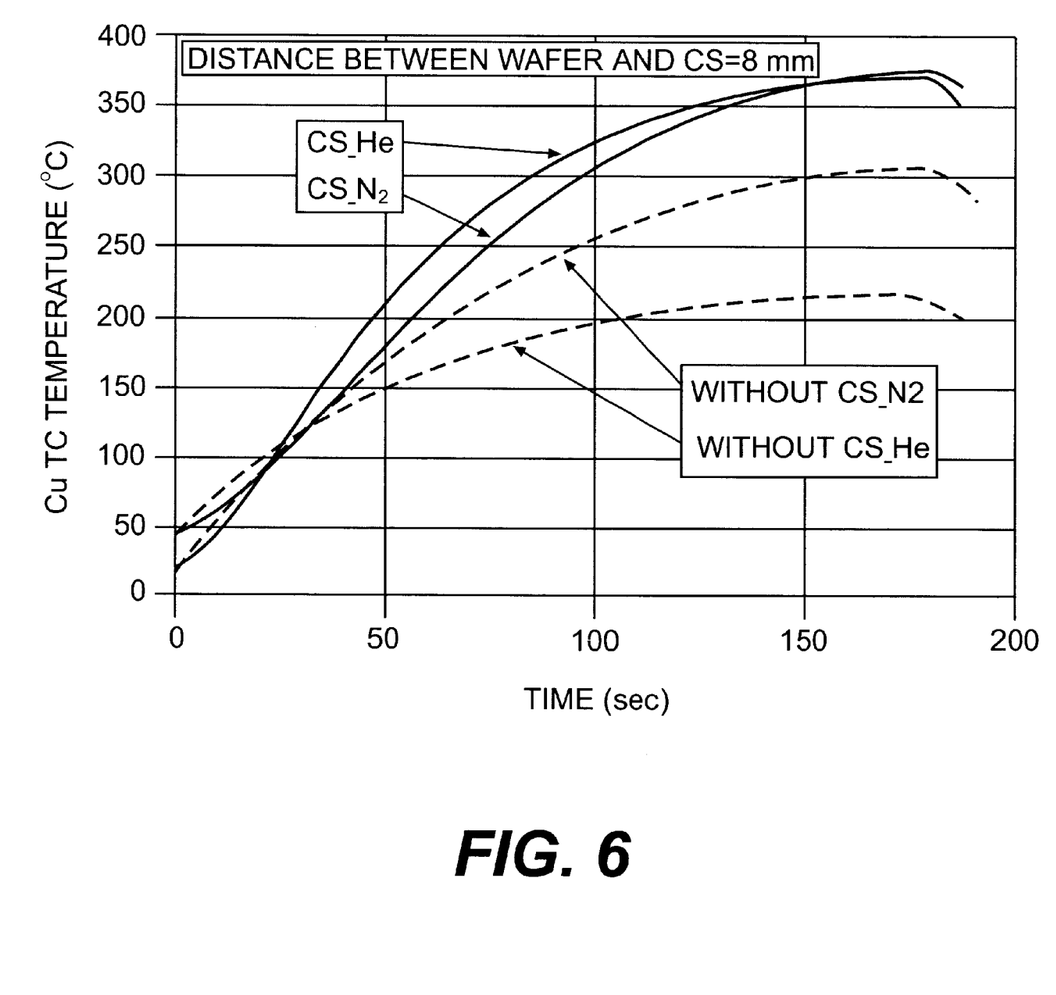
FIG. 6 is a graphical representation of the results obtained in the Example.

The results are illustrated in FIG. 6. As shown, by using a shield member of the present invention, the heating rate of the wafer was significantly increased. Moreover, the results further demonstrate that a system of the present invention can provide better control of wafer temperature because the wafer temperature is not directly dependent on the particular gas used during processing.

A third experiment was also conducted to demonstrate the overall effectiveness of a system of the present invention.

The copper-coated wafer was first heated at 5 different lamp intensities. A shield member (CS) was then placed 8 mm above the copper-coated wafer. Both the shield member and wafer were subsequently heated again at the same 5 lamp intensities previously tested. In each case, the temperature of the copper-coated wafer, the shield member temperature, and the lamp pinch seal temperature were determined. The following results were obtained.

| Lamp Intensity | Cu-coated wafer Temperature Without CS (° C.) | Cu-coated wafer Temperature With CS (° C.) | CS Temperature (° C.) | Lamp pinch seal Temperature |
|---|---|---|---|---|
| 15% |  | 470 | 749 | 173 |
| 25% |  | >480 | >900 | 250 |
| 30% | 360 |  |  | 351 |
| 35% | 466 |  |  | 384 |
| 40% | 548 |  |  | >400 |

As shown above, the system of the present invention achieves higher wafer temperatures with a lower lamp intensity, and a lower lamp pinch seal temperature thereby increasing the lamp lifetime.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method of oxidizing and reducing a reflective metal coating on a semiconductor wafer, said method comprising the steps of:

providing a wafer in a thermal processing chamber, said wafer including a reflective metal coating;

placing a shield member between a heating device and said semiconductor wafer within said thermal processing chamber, said shield member being made from a material that increases in temperature as said semiconductor wafer is heated, said shield member being capable of absorbing heat emitted by said heating device and reflected by said reflective metal coating when heated, said shield member being configured to heat said semiconductor wafer during processing;

exposing said shield member to light energy emitted by said heating device for heating said wafer in said thermal processing chamber while simultaneously flowing an oxidizing gas through said processing chamber, said oxidizing gas reacting with said metal coating to oxidize at least a portion of said metal; and thereafter exposing said shield member to further amounts of light energy emitted by said heating device for heating said wafer in said thermal processing chamber while simultaneously flowing a reducing gas through said processing chamber, said reducing gas reaching with said metal coating to convert said oxidized metal back to said metal, said oxidizing and said reducing reactions increasing the uniformity of said metal coating.

2. A method as defined in claim 1, further comprising the steps of:

monitoring the temperature of said shield member while said semiconductor wafer is heated;

determining the temperature of said semiconductor wafer based on the temperature of said shield member; and controlling the amount of light energy being delivered to said thermal processing chamber during thermal processing based upon the determined temperature of said semiconductor wafer.

3. A method as defined in claim 1, wherein said shield member is placed less than about 10 millimeters away from said semiconductor wafer.

4. A method as defined in claim 1, wherein said reflective metal coating comprises copper.

5. A method as defined in claim 1, wherein said oxidizing gas comprises water vapor.

6. A method as defined in claim 1, wherein said oxidizing gas comprises oxygen.

7. A method as defined in claim 1, wherein said semiconductor wafer is heated to a temperature less than about 600° C. while said oxidizing gas is flowing through said chamber.

8. A method as defined in claim 1, wherein said reducing gas comprises hydrogen.

9. A method as defined in claim 2, wherein the temperature of said shield member is monitored using a thermocouple.

10. A method as defined in claim 2, wherein the temperature of said shield member is monitored using at least one pyrometer.

11. A method as defined in claim 1, wherein said semiconductor wafer includes a top surface, said top surface being completely covered by said reflective metal coating.

12. A method as defined in claim 1, wherein said reflective metal coating is coated onto said semiconductor wafer in a pattern.

13. A method as defined in claim 1, wherein said shield member comprises a material having a high emissivity.

14. A method as defined in claim 1, wherein said shield member is made from a material comprising silicon.

15. A method as defined in claim 1, wherein said shield member is made from a material comprising silicon carbide.

* * * * *